US009835688B2

United States Patent
Zhu et al.

(10) Patent No.: US 9,835,688 B2
(45) Date of Patent: Dec. 5, 2017

(54) BATTERY-PACK FAULT DETECTING DEVICE AND METHOD FOR DETECTING FAULT OF BATTERY-PACK

(71) Applicant: BYD COMPANY LIMITED, Shenzhen (CN)

(72) Inventors: Xiang Zhu, Shenzhen (CN); Zhiqiang He, Shenzhen (CN); Yun Yang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 266 days.

(21) Appl. No.: 14/653,576

(22) PCT Filed: Dec. 17, 2013

(86) PCT No.: PCT/CN2013/089666
§ 371 (c)(1),
(2) Date: Jun. 18, 2015

(87) PCT Pub. No.: WO2014/094597
PCT Pub. Date: Jun. 26, 2014

(65) Prior Publication Data
US 2015/0346284 A1    Dec. 3, 2015

(30) Foreign Application Priority Data

Dec. 21, 2012   (CN) .......................... 2012 1 0559350

(51) Int. Cl.
*H02J 7/00*    (2006.01)
*H02J 7/14*    (2006.01)
(Continued)

(52) U.S. Cl.
CPC ....... *G01R 31/3658* (2013.01); *G01R 31/362* (2013.01); *H01M 10/482* (2013.01); *G01R 19/16542* (2013.01); *G01R 35/00* (2013.01)

(58) Field of Classification Search
USPC ....... 320/116, 118, 134, 136, 122, 132, 161, 320/117, 120, 121, 128; 324/434, 426,
(Continued)

(56) References Cited

U.S. PATENT DOCUMENTS 6,104,164 A  *  8/2000  Iino .................. G01R 15/04
                                               320/116
8,269,460 B2 *  9/2012  Ishikawa ............ B60L 11/14
                                               320/122
(Continued)

FOREIGN PATENT DOCUMENTS

CN       2426242 Y       4/2001
CN       1489236 A       4/2004
(Continued)

OTHER PUBLICATIONS

The World Intellectual Property Organization (WIPO) International Search Report for PCT/CN2013/089666, dated Mar. 20, 2014.

*Primary Examiner* — Alexis Pacheco
(74) *Attorney, Agent, or Firm* — Anova Law Group, PLLC

(57) ABSTRACT

A battery-pack fault detecting device and a method for detecting a fault of a battery pack are provided. The battery-pack fault detecting device includes: N diodes, in which each battery is connected with one of the N diodes in anti-parallel via a detecting line; N+1 switches; a switch control circuit for switching on or switching off each switch; a voltage collecting circuit connected with the switch control circuit for collecting a voltage of the battery; an analog-to-digital conversion circuit for performing an analog-digital conversion on the voltage of the battery to obtain a digital voltage; a detection control circuit connected with the switch control circuit and the analog-to-digital conversion circuit, for controlling the switch control circuit to switch on or off
(Continued)

each switch and for comparing the digital voltage with a preset value to judge a fault of the battery pack.

11 Claims, 3 Drawing Sheets

(51) Int. Cl.
    *G01R 31/36*     (2006.01)
    *H01M 10/48*     (2006.01)
    *G01R 35/00*     (2006.01)
    *G01R 19/165*     (2006.01)

(58) Field of Classification Search
    USPC .................................................. 324/427, 433
    See application file for complete search history.

(56) References Cited

U.S. PATENT DOCUMENTS

| | | | | |
|---|---|---|---|---|
| 2007/0114973 A1* | 5/2007 | Miyamoto | ........... | G01R 31/362 320/132 |
| 2007/0285054 A1* | 12/2007 | Li | ........... | G01R 31/362 320/116 |
| 2008/0284375 A1* | 11/2008 | Nagaoka | ........... | B60L 11/1855 320/116 |
| 2009/0091332 A1* | 4/2009 | Emori | ........... | B60L 11/1855 324/537 |
| 2009/0130542 A1* | 5/2009 | Mizoguchi | ........ | H01M 10/4207 429/61 |
| 2010/0109607 A1* | 5/2010 | Zheng | ........... | H02J 7/0016 320/118 |
| 2011/0234162 A1* | 9/2011 | Kinoshita | ........... | H01M 10/441 320/116 |
| 2012/0098547 A1 | 4/2012 | Inoue et al. | | |
| 2013/0300371 A1* | 11/2013 | Bills | ...................... | H02J 7/0016 320/118 |
| 2014/0159735 A1* | 6/2014 | Buzon | ............. | G01R 19/16542 324/426 |

FOREIGN PATENT DOCUMENTS

| | | |
|---|---|---|
| CN | 1567645 A | 1/2005 |
| CN | 101145625 A | 3/2008 |
| CN | 101207296 A | 6/2008 |
| CN | 201311484 Y | 9/2009 |
| CN | 201750183 U | 2/2011 |
| CN | 102331561 A | 1/2012 |
| CN | 202121023 U | 1/2012 |
| CN | 202142843 U | 2/2012 |
| CN | 102426339 A | 4/2012 |
| CN | 102723754 A | 10/2012 |
| CN | 202503353 U | 10/2012 |
| JP | 2003163017 A | 6/2003 |
| WO | 2012143422 A1 | 10/2012 |

* cited by examiner

BATTERY-PACK FAULT DETECTING DEVICE AND METHOD FOR DETECTING FAULT OF BATTERY-PACK

CROSS-REFERENCE TO RELATED APPLICATION

This application is a national phase entry under 35 U.S.C. §371 of International Application No. PCT/CN2013/089666, filed on Dec. 17, 2013, which claims priority to, and benefits of Chinese Patent Application Serial No. 201210559350.2, filed with the State Intellectual Property Office of P. R. C. on Dec. 21, 2012, the entire content of all of which is incorporated herein by reference.

TECHNICAL FIELD

Exemplary embodiments of the present disclosure relate generally to the field of battery technologies and, more particularly, relate to a battery-pack fault detecting device and a method for detecting a fault of a battery pack.

BACKGROUND

Batteries are widely used in all kinds of electronic products like notebooks, mobile phones, and electric vehicles. Because a single battery usually cannot supply enough power, a plurality of single batteries are connected in series and/or in parallel to increase battery power or output efficiency.

In practice, many electronic products use a battery pack formed by a plurality of batteries connected in series as a power supply. In such case, an internal connection of the whole battery pack should be reliable, in order to avoid impact on power supplying due to a fault of a single battery. Otherwise, charging and discharging of the battery pack may be seriously affected and security of the battery pack cannot be guaranteed. Especially for a battery pack formed by lithium batteries, it usually needs a battery management system to detect the internal connection of the whole battery pack before starting the battery pack. Conventionally, a voltage of each battery of the battery pack is measured by a detecting device, and then the voltage is compared with a preset value to judge whether the battery has a fault. However, measuring the voltage by the detecting device needs an electric wire (i.e., a detecting line) to connect the battery and the detecting device. Because a distance between the battery and the detecting device is usually comparatively long, a comparatively long electric wire is easier to break down. However, an electric wire inside of the detecting device is comparatively short and thus it is not easy to break down. When the detecting device is connected to the battery via the electric wire, if a fault (such as an open circuit) is detected between both ends of a single battery, it's hard to judge whether the fault is caused by the single battery or by the electric wire.

SUMMARY

Embodiments of the present disclosure seek to solve at least one of the problems existing in the related art to at least some extent.

According to a first aspect of the present disclosure, a battery-pack fault detecting device is provided for detecting a fault of a battery pack containing a plurality of batteries connected in series. The battery-pack fault detecting device comprises N diodes, wherein each battery is connected with one of the N diodes in anti-parallel via a detecting line, and two adjacent batteries share one detecting line; N+1 switches; a switch control circuit, for switching on or switching off each switch, wherein each switch is connected between one diode and the switch control circuit; a voltage collecting circuit, connected with the switch control circuit for collecting a voltage of the battery; an analog-to-digital conversion circuit, connected with the voltage collecting circuit for performing an analog-digital conversion on the voltage of the battery to obtain a digital voltage; a detection control circuit, connected with the switch control circuit and the analog-to-digital conversion circuit, for controlling the switch control circuit to switch on or switch off each switch and for comparing the digital voltage with a preset value to judge a fault of the battery pack.

In one embodiment, the battery-pack fault detecting device further comprises a filtering circuit connected between the voltage collecting circuit and the analog-to-digital conversion circuit.

In one embodiment, the battery pack fault detecting device further comprises an alarm circuit connected with the detection control circuit for alarming the fault of the battery pack.

In one embodiment, the battery pack fault detecting device further comprises an (N+1)th diode for absorbing a surge, wherein a cathode of the (N+1)th diode is connected with a negative electrode of a first battery, and an anode of the (N+1)th diode is grounded.

According to a second aspect of the present disclosure, a method for detecting a fault of a battery pack containing a plurality of batteries connected in series is provided. The method comprises steps of: step 1, detecting a voltage of each battery in a preset sequence, specifically: only switching on two switches at both ends of an Nth battery each time, collecting a voltage of the Nth battery, and performing an analog-digital conversion on the voltage of the Nth battery to obtain a digital voltage; step 2, judging whether the digital voltage reaches a preset value A, if yes, following step 3; if no, following step 5; step 3, only switching on two switches at both ends of the Nth and an (N−1)th batteries; collecting a voltage V'n of the Nth and the (N−1)th batteries; and performing the analog-to-digital conversion on the voltage V'n to obtain a digital voltage V"n; only switching on two switches at both ends of the Nth and the (N+1)th batteries, collecting a voltage V'n+1 of the Nth and the (N+1)th batteries, and performing the analog-to-digital conversion on the voltage V'n+1 to obtain a digital voltage V"n+1; step 4, judging whether an average value of V"n and V"n+1 reaches a preset value B, if yes, judging that the Nth battery has a fault; if no, judging that detecting lines at both ends of the Nth battery have a fault; step 5, judging whether voltages of all batteries have been collected, if yes, terminating the fault detecting; if no, returning to step 1.

In one embodiment, the step 1 further comprises: filtering the voltage of the Nth battery before performing the analog-to-digital conversion on the voltage of the Nth battery to obtain a digital voltage.

In one embodiment, the step 3 further comprises: filtering the voltage V'n of the Nth and the (N−1)th batteries before performing the analog-to-digital conversion on the voltage V'n to obtain a digital voltage V"n; and filtering the voltage V'n+1 of the Nth and the (N+1)th batteries before performing the analog-to-digital conversion on the voltage V'n+1 to obtain a digital voltage V"n+1.

In one embodiment, the step 4 further comprises alarming that the Nth battery has a fault or the detecting lines at both ends of the Nth battery have a fault.

In one embodiment, each battery is connected with a diode in anti-parallel via a detecting line, and two adjacent batteries share one detecting line.

In one embodiment, the preset value A is a forward voltage drop of the diode connected with the Nth battery in anti-parallel.

In one embodiment, the preset value B is a sum of a rated voltage of the Nth battery and a forward voltage drop of the diode connected with the Nth battery in anti-parallel.

In one embodiment, the preset value B ranges from 95% to 105% of a rated voltage of the Nth battery.

With the battery-pack fault detecting device and the method for detecting the fault of the battery pack according to embodiments of the present disclosure, each battery is connected with one diode in anti-parallel, each switch is switched on or switched off by the switch control circuit controlled by the detection control circuit to select one or two batteries for detecting, a voltage of the one or two batteries is collected by the voltage collecting circuit and then the voltage of the one or two batteries is converted into a digital value, and the digital value is compared with a preset value. In this way, it is judged quickly which branch has a fault and whether the fault is caused by the battery or by the detecting line. The method is not only accurate and reliable but also may be implemented automatically and quickly. Moreover, the battery pack may be controlled selectively by using the device and the method.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
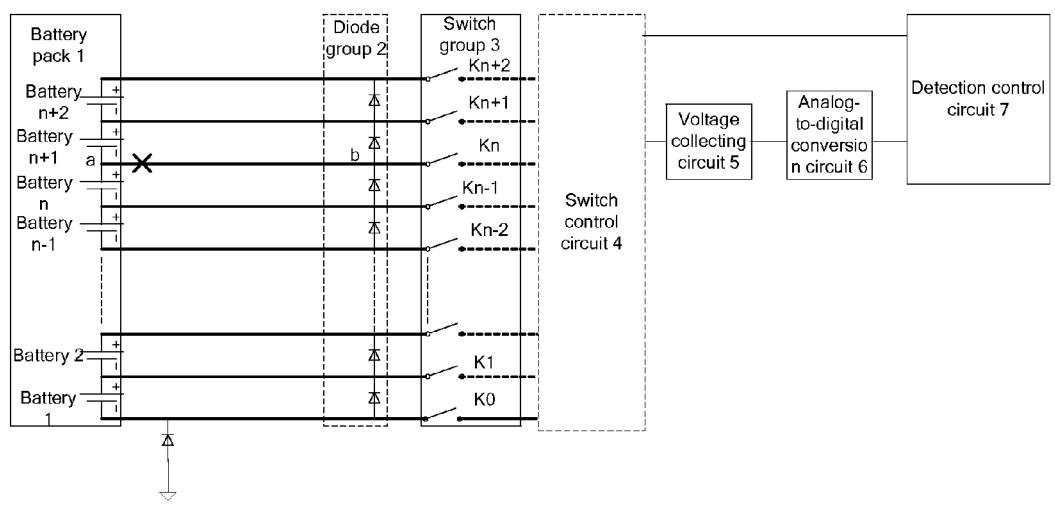
FIG. 1 is a schematic diagram of a battery-pack fault detecting device according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, unless specified or limited otherwise, relative terms such as "central", "longitudinal", "lateral", "front", "rear", "right", "left", "inner", "outer", "lower", "upper", "horizontal", "vertical", "above", "below", "up", "top", "bottom" as well as derivative thereof (e.g., "horizontally", "downwardly", "upwardly", etc.) should be construed to refer to the orientation as then described or as shown in the drawings under discussion. These relative terms are for convenience of description and may or may not require that the present disclosure be constructed or operated in a particular orientation.

Figure 2:
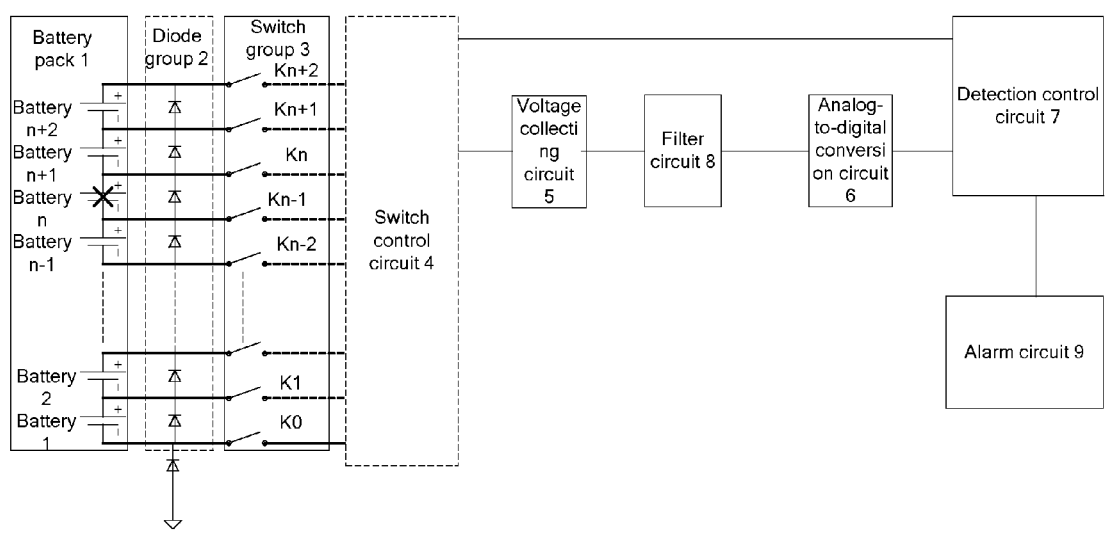
FIG. 2 is a schematic diagram of a battery-pack fault detecting device according to an embodiment of the present disclosure.
Figure 3:
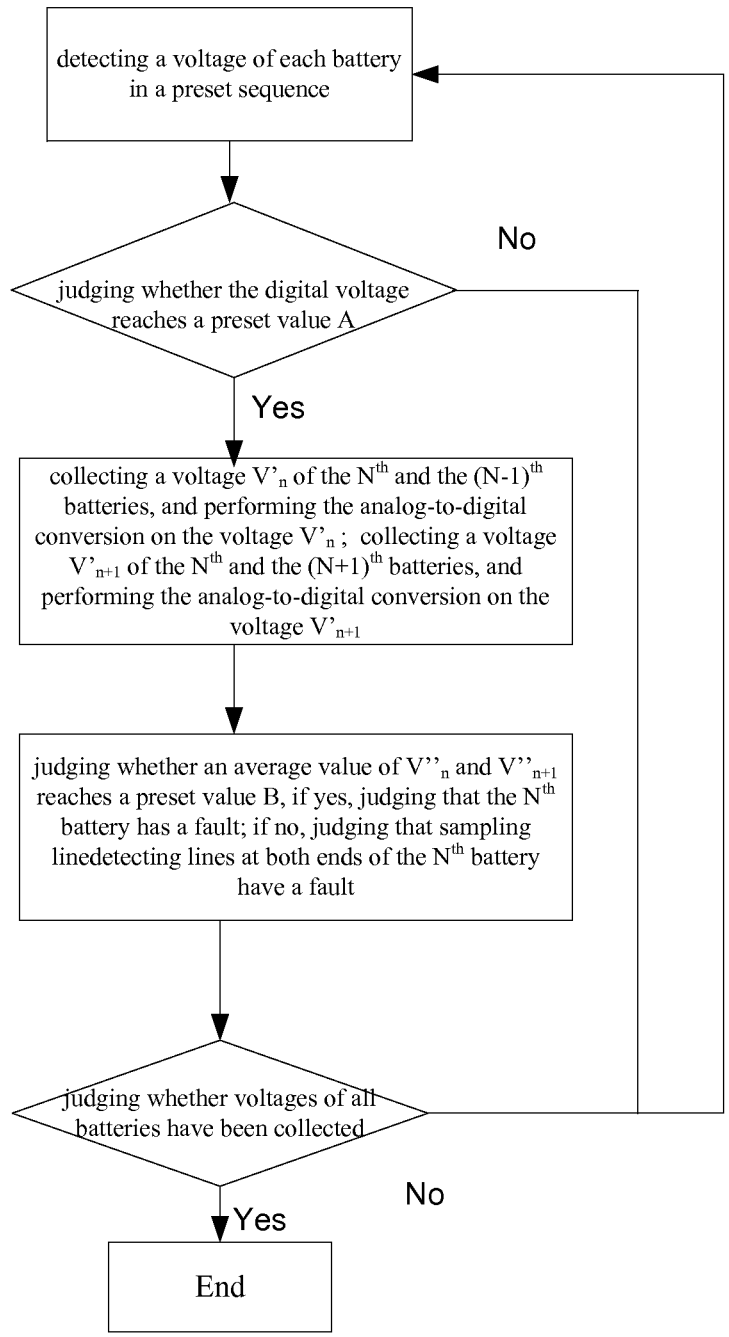
FIG. 3 is a flow chart of a method for detecting a fault of a battery pack according to an embodiment of the present disclosure.

As shown in FIG. 1 to FIG. 3, a battery-pack fault detecting device according to an embodiment of the present disclosure is mainly for detecting a battery pack comprising a plurality of identical batteries connected in series and quickly judging whether a single battery or a detecting line has a fault. The battery pack fault detecting device according to an embodiment of the present disclosure comprises: N diodes which constitute a diode group 2, N+1 switches which constitute a switch group 3, a switch control circuit 4, an analog-to-digital conversion circuit 6, a voltage collecting circuit 5 and a detecting control circuit 7. Each battery is connected with one of the N diodes in anti-parallel via the detecting line, and two adjacent batteries share one detecting line. Therefore, the number of the diodes of the diode group 2 is the same as the number of batteries of the battery pack 1, the number of the switches of the switch group 3 is greater than the number of the batteries of the battery pack 1 by 1. Each switch is connected between one diode and the switch control circuit, that is, one end of each diode is connected with the switch control circuit 4 via one switch of the switch group 3. The switch control circuit 4 is for switching on or switching off each switch of the switch group 3 and is electrically connected with the voltage collecting circuit 5, the analog-to-digital conversion circuit 6 and the detection control circuit 7 in sequence. The diode of the diode group 2 may prevent the detecting line from floating when the detecting line is disconnected, so that the voltage collecting circuit 5 is connected with one end of the adjacent battery via the diode. And when there is a peak pulse of a relatively high voltage applied on the detecting line, the diode may be reversely conducted to release a peak voltage. The detecting control circuit 7 controls the switch control circuit 4 to send a signal to switch one or two switches on or off. After the one or two switches are switched on by the switch control circuit 4, one or two batteries are connected with the voltage collecting circuit 5 via the one or two switches and the switch control circuit 4. In this way, the voltage collecting circuit 5 collects a voltage of the battery, the analog-to-digital conversion circuit performs an analog-digital conversion on the voltage of the battery to obtain a digital voltage and then sends the digital voltage to the detecting control circuit 7. The detection control circuit 7 compares the digital voltage with a preset value to judge a fault of the battery pack.

FIG. 2 is a schematic diagram of a battery-pack fault detecting device according to an embodiment of the present disclosure. As shown in FIG. 2, a battery pack comprises N+2 batteries connected in series, a diode group 2 comprises N+2 diodes, and a switch group 3 comprises N+3 switches denoted from K0 to Kn+2. Each battery is connected with one diode in anti-parallel via a detecting line, two adjacent batteries share one detecting line, and each diode is connected with a switch control circuit 4 via one switch. Therefore, one or two switches are switched off by the switch control circuit 4 when receiving a signal from the detection control circuit 7. For example, a switch Kn−1 and a switch Kn are switched on so that the Nth battery is connected with the voltage collecting circuit 5 via the switches and the switch control circuit 4, and thus the voltage collecting circuit 5 collects a voltage of the Nth battery. The analog-to-digital conversion circuit performs an analog-digital conversion on the voltage of the Nth battery to obtain a digital voltage, and sends the digital voltage to the detection control circuit 7 to be compared with a preset value and thus judging a fault of the battery pack. In order to improve an accuracy of the collected voltage, preferably, a filtering circuit 8 is connected between the voltage collecting circuit 5 and the analog-to-digital conversion circuit 6, so as to filter the voltage collected by the voltage collecting circuit 5 before performing the analog-to-digital conversion on the collected voltage. By comparing the digital voltage with the preset value by the detection control circuit 7, it is judged whether a branch comprising one or two batteries has a fault and whether the fault occurs to the one or two batteries or to the detecting line. In order to inform a user of a detecting result promptly, an output end of the detection control circuit 7 is electrically connected with an alarm circuit 9 for alarming the fault distinguishingly. Preferably, the battery pack fault detecting device further comprises a diode connected between the first battery and the ground. A cathode of the diode is connected with a negative electrode of the first battery, and an anode of the diode is grounded so as to absorb a surge close-by the battery. Structures of the switch control circuit 4, the analog-to-digital conversion circuit 6, the filtering circuit 8 and the alarm circuit 9 are well known by those skilled in the art.

According to embodiments of the present disclosure, a method for detecting a fault of a battery pack 1 is provided. As shown in FIG. 1 to FIG. 3, the method comprises following steps.

In step 1, a voltage of each battery is detected in a preset sequence, that is, only two switches at both ends of an Nth battery are switched on each time, a voltage of the Nth battery is collected, and an analog-digital conversion is performed on the voltage of the Nth battery to obtain a digital voltage. For example, the switch control circuit 4 switches on a switch Kn−1 and a switch Kn, thus collecting the voltage of the Nth battery.

In step 2, it is judged whether the digital voltage reaches a preset value A, if yes, step 3 is followed; if no, step 5 is followed. That is, by comparing the digital voltage Vn of the Nth battery with the preset value A, it is judged whether the digital voltage reaches the preset value A, if yes, it is indicated that a branch comprising the battery has a fault, step 3 is followed to detect two batteries, so as to further judge whether the battery or the detecting line has a fault; if no, step 5 is followed.

In step 3, only two switches at both ends of the Nth and an (N−1)th batteries are switched on, a voltage V'n of the Nth and the (N−1)th batteries is collected, and the analog-to-digital conversion is performed on the voltage V'n to obtain a digital voltage V"n; only two switches at both ends of the Nth and the (N+1)th batteries are switched on, a voltage V'n+1 of the Nth and the (N+1)th batteries is collected, and the analog-to-digital conversion is performed on the voltage V'n+1 to obtain a digital voltage V"n+1. In this step, a first double-battery group (i.e., the Nth and the (N−1)th batteries) and a second double-battery group (i.e., the Nth and the (N−1)th batteries) are detected respectively. The detection control circuit 7 sends a signal to only switch on the two switches Kn and Kn+2 at both ends of the Nth and the (N−1)th batteries to detect the voltage of the first double-battery group, and sends a signal to only switch on the two switches Kn−1 and Kn+1 at both ends of the Nth and the (N+1)th batteries to detect the voltage of the second double-battery group. It should be noted that a detecting sequence of the voltage V'n and V'n+1 may be exchanged.

In step 4, it is judged whether an average value of V"n and V"n+1 reaches a preset value B, if yes, it is judged that the Nth battery has a fault; if no, it is judged that detecting lines at both ends of the Nth battery have a fault.

In step 5, it is judged whether voltages of all batteries have been collected, if yes, a fault detecting is terminated; if no, step 1 is followed. A method for judging whether the voltages of all batteries are collected or not is well known by those skilled in the art, for example, it may be realized by judging whether all adjacent switches have been switched on simultaneously.

As shown in FIG. 1, if it is found that a branch comprising the Nth battery has a fault, no matter the Nth battery or the detecting line has a fault, the diode is connected with the voltage collecting circuit 4 via switches at both ends of the diode and the switch control circuit 4, therefore the preset value A is a forward voltage drop of the diode connected with the Nth battery in anti-parallel. The forward voltage drop of a common diode is 0.7 V, but because the battery pack fault detecting device is usually influenced by an environmental electromagnetic interference, the preset value A preferably ranges from 90% to 110% of the forward voltage drop of the diode. For example, when the voltage Vn of a single battery approximates zero, it may be judged that the branch comprising the single battery has a fault. The batteries of the battery pack 1 are usually of a same type, so the diodes of the diode pack 2 are usually of a same type.

Further, the Nth battery is judged to have a fault when the average value of V"n and V"n+1 reaches the preset value B. The preset value B may be a sum of a rated voltage of the Nth battery and the forward voltage drop of the diode. A reason may be illustrated as follows. As shown in FIG. 1, given that the voltage of single batteries with the same type is U, the forward voltage drop of each diode is V, when the Nth battery has a fault, V'n=U+V, V'n+1=U+V, so the average value of V'n and V'n+1 is U+V. When a detecting line connected with a positive electrode of the Nth battery (i.e., the detecting line connected with a negative electrode of the (N+1)th battery) has a fault, V'n=U+V, V'n+1=2 U, so the average value of V'n and V'n+1 is 1.5 U+0.5V. A value of V is usually very small, and the battery-pack fault detecting device is usually influenced by the environmental electromagnetic interference, so the preset value B may range from 95% to 105% of the rated voltage of the Nth battery. Each battery is connected with one diode in anti-parallel via the detecting line, which may prevent the detecting line from floating when the detecting line is disconnected, so that the voltage collecting circuit 5 is connected with one end of the adjacent battery via the diode. And when there is a peak pulse of a relatively high voltage applied on the detecting line, the diode may be reversely conducted to release a peak voltage. Preferably, the step 10 further comprises filtering the voltage of the Nth battery before performing the analog-to-digital conversion on the voltage of the Nth battery, so as to reduce an influence of external interference on the detected voltage. Moreover, because a branch fault judged by the detection control circuit 7 may be a fault of the battery or a fault of the detecting line connected with both ends of the battery, preferably, the step 4 further comprises alarming that the Nth battery has the fault or the detecting lines at both ends of the Nth battery have the fault so as to allow the user to get the fault in details and on time.

With the battery-pack fault detecting device and the method for detecting the fault of the battery pack according to embodiments of the present disclosure, it is judged quickly which branch has a fault and whether the fault is caused by the battery or by the detecting line. The method is not only accurate and reliable but also may be implemented automatically and quickly. Moreover, the battery pack may be controlled selectively by using the device and the method.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A battery-pack fault detecting device for detecting a battery pack comprising a plurality of N batteries connected in series and N being an integer greater than two, comprising:
    N diodes, wherein each battery is connected with one of the N diodes in anti-parallel via a detecting line, and two adjacent batteries share one detecting line;
    N+1 switches;
    a switch control circuit, for switching on or switching off each switch of the N+1 switches in sequence, wherein each switch is connected between one diode and the switch control circuit, and one end of each diode of the N diodes is connected with the switch control circuit via one switch of the N+1 switches;
    a voltage collecting circuit, connected with the switch control circuit for collecting a voltage of the battery connected to the switch of the N+1 switches being switched on;
    an analog-to-digital conversion circuit, connected with the voltage collecting circuit for performing an analog-digital conversion on the voltage of the battery to obtain a digital voltage; and
    a detection control circuit, connected with the switch control circuit and the analog-to-digital conversion circuit, for controlling the switch control circuit to switch on or switch off each switch and for comparing the digital voltage with a preset value to judge a fault of the battery pack.

2. The battery pack fault detecting device according to claim 1, further comprising a filtering circuit connected between the voltage collecting circuit and the analog-to-digital conversion circuit.

3. The battery pack fault detecting device according to claim 1, further comprising an alarm circuit connected with the detection control circuit for alarming the fault of the battery pack.

4. The battery pack fault detecting device according to claim 1, further comprising an $(N+1)^{th}$ diode for absorbing a surge, wherein a cathode of the $(N+1)^{th}$ diode is connected with a negative electrode of a first battery of the N batteries, and an anode of the $(N+1)^{th}$ diode is grounded.

5. A method for detecting a fault of a battery pack comprising a plurality of (N+1) batteries connected in series, a plurality of switches and a switch control circuit, and N being an integer greater than two, wherein the plurality of (N+1) batteries is connected with the switch control circuit via the plurality of switches, comprising:
    step 1, detecting a voltage of each battery in a preset sequence, comprising: only switching on two switches at both ends of an $N^{th}$ battery each time, collecting a voltage of the $N^{th}$ battery, and performing an analog-digital conversion on the voltage of the $N^{th}$ battery to obtain a digital voltage;
    step 2, judging whether the digital voltage reaches a preset value A and, if yes, following step 3; if no, following step 5;
    step 3, only switching on two switches at both ends of the $N^{th}$ and an $(N-1)^{th}$ batteries, collecting a voltage $V'_n$ of the $N^{th}$ and the $(N-1)^{th}$ batteries, and performing the analog-to-digital conversion on the voltage $V'_n$ to obtain a digital voltage $V''_n$; only switching on two switches at both ends of the $N^{th}$ and the $(N+1)^{th}$ batteries, collecting a voltage $V'_{n+1}$ of the $N^{th}$ and the $(N+1)^{th}$ batteries, and performing the analog-to-digital conversion on the voltage $V'_{n+1}$ to obtain a digital voltage $V''_{n+1}$;
    step 4, judging whether an average value of $V''_n$ and $V''_{n+1}$ reaches a preset value B and, if yes, judging that the $N^{th}$ battery has a fault; if no, judging that detecting lines at both ends of the $N^{th}$ battery have a fault; and
    step 5, judging whether voltages of all batteries have been collected, if yes, terminating fault detecting; if no, returning to step 1.

6. The method according to claim 5, wherein the step 1 further comprises: filtering the voltage of the $N^{th}$ battery before performing the analog-to-digital conversion on the voltage of the $N^{th}$ battery to obtain a digital voltage.

7. The method according to claim 5, wherein the step 3 further comprises:
    filtering the voltage $V'_n$ of the $N^{th}$ and the $(N-1)^{th}$ batteries before performing the analog-to-digital conversion on the voltage $V'_n$ to obtain a digital voltage $V''_n$; and
    filtering the voltage $V'_{n+1}$ of the $N^{th}$ and the $(N+1)^{th}$ batteries before performing the analog-to-digital conversion on the voltage $V'_{n+1}$ to obtain a digital voltage $V''_{n+1}$.

8. The method according to claim 5, wherein the step 4 further comprises alarming that the $N^{th}$ battery has the fault or the detecting lines at both ends of the $N^{th}$ battery have the fault.

9. The method according to claim 5, wherein each battery is connected with a diode in anti-parallel via a detecting line, and two adjacent batteries share one detecting line.

10. The method according to claim 9, wherein the preset value A is a forward voltage drop of the diode connected with the $N^{th}$ battery in anti-parallel.

11. The method according to claim 9, wherein the preset value B is a sum of a rated voltage of the $N^{th}$ battery and a forward voltage drop of the diode connected with the $N^{th}$ battery in anti-parallel.

* * * * *